United States Patent
Yakushiji

(10) Patent No.: US 7,572,657 B2
(45) Date of Patent: Aug. 11, 2009

(54) METHOD FOR FABRICATION OF SEMICONDUCTOR LIGHT-EMITTING DEVICE AND THE DEVICE FABRICATED BY THE METHOD

(75) Inventor: Kenji Yakushiji, Ichihara (JP)

(73) Assignee: Showa Denko K.K., Tokyo (JP)

( * ) Notice: Subject to any disclaimer, the term of this patent is extended or adjusted under 35 U.S.C. 154(b) by 204 days.

(21) Appl. No.: 10/573,017

(22) PCT Filed: Aug. 17, 2005

(86) PCT No.: PCT/JP2005/015308

§ 371 (c)(1), (2), (4) Date: Jan. 19, 2007

(87) PCT Pub. No.: WO2006/019180

PCT Pub. Date: Feb. 23, 2006

(65) Prior Publication Data

US 2008/0121906 A1    May 29, 2008

Related U.S. Application Data

(60) Provisional application No. 60/605,500, filed on Aug. 31, 2004.

(30) Foreign Application Priority Data

Aug. 20, 2004    (JP) .............................. 2004-240764

(51) Int. Cl.
*H01L 21/00*    (2006.01)
*H01L 33/00*    (2006.01)
(52) U.S. Cl. .......................................... 438/33; 257/98
(58) Field of Classification Search ................. 438/33, 438/43, 68, 113; 257/200, 82, 98, E25.028, 257/E25.032, E33.011–E33.077
See application file for complete search history.

(56) References Cited

U.S. PATENT DOCUMENTS 6,156,584 A * 12/2000 Itoh et al. ..................... 438/33

(Continued)

FOREIGN PATENT DOCUMENTS

CN    1484328 A    3/2004

(Continued)

OTHER PUBLICATIONS

A. R. Franklin, et al, "Shaped Electroluminescent GaAs Diodes", Journal of Applied Physics, vol. 35, No. 4, Apr. 1964, pp. 1153-1155.

*Primary Examiner*—Calvin Lee
(74) *Attorney, Agent, or Firm*—Sughrue Mion, PLLC

(57) ABSTRACT

A method for producing a semiconductor light-emitting device includes stacking at least a first conductive type semiconductor layer (2), an active layer (3) and a second conductive type semiconductor layer (4) on a substrate (1) to form a wafer, then forming on a side of growth surfaces of the semiconductor layers first trenches (40) exposing the first conductive type semiconductor layer, further forming second trenches (50) reaching the substrate from above the first trenches by using a laser beam, subsequently forming third trenches (60) from the substrate at the positions corresponding to the second trenches, and finally cutting the wafer into chips. The produced semiconductor chips provide an enhanced efficiency of extracting emitted light even when the end faces thereof are smooth surfaces and they allow the semiconductor layer to be cut without distorting the end faces of the chips.

10 Claims, 2 Drawing Sheets

U.S. PATENT DOCUMENTS

2004/0051118 A1\* 3/2004 Bruhns et al. ............... 257/200
2005/0186760 A1 8/2005 Hashimura et al.

FOREIGN PATENT DOCUMENTS

| JP | 5-343742 A | 12/1993 |
| JP | 6-244458 A | 9/1994 |
| JP | 11-163403 A | 6/1999 |
| JP | 11-354841 A | 12/1999 |
| JP | 2001-284291 A | 10/2001 |
| JP | 2001-284293 A | 10/2001 |
| JP | 2003-17790 A | 1/2003 |
| JP | 2003-78164 A | 3/2003 |
| JP | 2003-218065 A | 7/2003 |
| JP | 2003-338638 A | 11/2003 |
| JP | 2004-31526 A | 1/2004 |
| JP | 2005-252245 A | 9/2005 |

\* cited by examiner

Chip separating plane

METHOD FOR FABRICATION OF SEMICONDUCTOR LIGHT-EMITTING DEVICE AND THE DEVICE FABRICATED BY THE METHOD

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/605,500 filed Aug. 31, 2004 and Japanese Patent Application No. 2004-240764 filed Aug. 20, 2004 pursuant to 35 U.S.C. §111(b).

TECHNICAL FIELD

This invention relates to a method for the fabrication of a semiconductor light-emitting device. More particularly, this invention relates to a light-emitting device of high luminance so severed as to acquire a clean and smooth surface and provide an improved efficiency of light extraction from a light-emitting chip and to a method for the fabrication thereof.

BACKGROUND ART

The process for fabricating a light-emitting device by severing into chips a nitride-based compound semiconductor wafer resulting from stacking an n-type layer, an active layer and a p-type layer on an insulating substrate, such as a sapphire substrate, comprises, as disclosed for example in JP-A HEI 05-343742, a step of etching a wafer to expose the n-type layer and form a trench shaped like a periphery of each chip, a step of polishing the substrate to decrease the thickness thereof, a step of inserting the diamond blade of a dicing saw into the trench and exposing the substrate, a step of inflicting a scribe line on the mark of dicing with a scriber, and a step of breaking the substrate with pressure to acquire chips. JP-A HEI 11-354841 discloses a severing process which comprises a step of exposing an n-type layer by etching and forming a trench shaped like a chip, a step of inserting the diamond blade of a dicing saw into the trench and exposing the substrate, a step of inflicting a scribing line with a scriber at a position corresponding to the dicing line from the second surface side of the substrate, and a step of breaking the substrate with pressure to acquire chips. These prior art references indicate that since the sapphire substrate and the nitride-based compound semiconductor layer are too hard to permit easy separation into chips by cleavage like GaAs and GaP, these substrates require decrease in thickness prior to separation into chips in order to be broken easily and they require dicing or scribing for imparting a stress concentrated part serving to facilitate breakage or forming a locally thinned portion serving to allow necessary breakage to occur at an expected position.

It has been known from long ago that the chip acquires an improved efficiency of light extraction when it is shaped like a reversed circular truncated cone. It is disclosed for example in Journal of Applied Physics, Vol. 35, 1964, page 1153, that when the light emitted from the emission region of a light-emitting device and injected through the lateral face of a chip is reflected in the direction of the emission observation face in the upper part of the chip and allowed to impinge substantially perpendicularly on the upper face of the chip, the light can be taken out of the chip without being reflected again on the emission observation face toward the interior of the chip. This technique can be effectively applied to the nitride-based compound semiconductor wafer using a sapphire substrate. JP-A HEI 06-244458, for example, discloses a technique which, in severing a flip-chip-type element from a chip, inserts a cut in the chip by dicing so as to separate a chip having an oblique lateral face.

The conventional processing devices have been used to adopt dicing saws using a diamond chip and scribers using a diamond chip. Recently, a device for forming a trench to be used in cutting chips by the use of a laser beam has been developed as disclosed, for example, in U.S. Pat. No. 6,413,839. The laser beam constitutes a processing technique which not only proves usable as a simple alternative means for the dicing saw and the scriber in popular use heretofore but also promises materialization of a processing method which has never been implemented by the conventional method. This technique, by controlling the beam diameter and the focal position of the laser beam and further the laser output and the duration of exposure, is enabled to vary the width and the depth of the trench to be formed. JP-A HEI 11-163403, for example, discloses a technique for forming a trench on the surface opposite the surface irradiated with the laser beam. Further, JP-B 2004-26766 discloses production of chips by a process which comprises a step of forming trenches shaped like chips by removing by etching part of the p-type layer and the light-emitting layer of a GaN epitaxial wafer produced by stacking an n-type GaN layer, a light-emitting layer and a p-type GaN layer on a substrate and used for a light-emitting device and consequently exposing the n-type layer, a step of polishing the substrate to decrease thickness, a step of irradiating the trenches from above with the laser beam and consequently forming trenches that expose the substrate and a step of breaking the substrate with pressure. Since a nitride-based compound semiconductor and a substrate for which an SiC and a sapphire is usually used are hard substances comparable to diamond, the processing performed thereon by the use of a dicing saw and a scriber has necessitated a highly advanced technique and consumed a long time. Since the use of the laser beam is capable of forming trenches narrower and deeper than those of the conventional processing devices, it can materialize the processing which has been accomplished by the conventional method only with difficulty.

The use of the laser-processing device allows forming of trenches deeper and stabler in shape than those obtained by the conventional dicing saws or scribers. Though the mechanism of breaking the sapphire substrate under pressure into chips while causing the stress exerted thereon to be concentrated on the bottom parts of the trenches is the same as in the conventional method, since the trenches are stable in shape, the end faces of the chips which form the parts for breaking the substrate can be severed with smooth facial shapes as compared with the conventional method. The use of the laser-processing device, however, results in bringing the luminance of emission of the LED chip to a lower level than the conventional method. Two causes are conceivable for this lowered luminance. One of them is the problem that the heat used during the laser processing may deteriorate the epitaxial layer. The other is the fact that since the end face of the chip is finished to be smoothed, the efficiency of light extraction in the end face of the chip is lowered as compared with the conventional method. The conventional method fails to obtain trenches in smoothed shape and consequently suffers broken faces to sustain a ragged contour and imparts an irregular jogging naturally to the end faces of the divided chips. In contrast, since the laser method is capable of forming trenches in a smooth and stable shape, it enables the broken faces to be finished in a smooth shape. The light from the emission region which is injected into the smooth shape tends to be reflected inside the chip and returned, with the result that the efficiency of light extraction through the end face of the chip will be degraded. This will be referred to as the first task concerning the processing.

There exists the second task concerning the processing which occurs in the conventional processing method and which also occurs in the laser method. Even when the laser method succeeds in forming deeper trenches, the substrate possibly will not be broken neatly in the cross sectional direction depending on the manner of exerting the stress during the division of the substrate into chips. That is, the stress has the possibility of warping the end faces of the chips.

The present inventor has made a diligent study with a view to solving the tasks mentioned above and has consequently arrived at this invention.

This invention has as an object thereof the provision of a method for fabricating a semiconductor light-emitting device which simultaneously solves the first task of enabling the light of emission to be extracted effectively even through a smooth surface and the second task of enabling the substrate to be broken into chips without warping the end faces of the chips during the course of breakage.

DISCLOSURE OF THE INVENTION

With a view to accomplishing the object mentioned above, the method for the fabrication of a semiconductor light-emitting device according to a first aspect of this invention comprises the steps of stacking at least a first conductive type semiconductor layer, an active layer and a second conductive type semiconductor layer on a substrate to form a wafer, forming on a side of growth surfaces of the semiconductor layers first trenches exposing the first conductive type semiconductor layer, forming second trenches reaching the substrate from above the first trenches by the use of a laser beam, forming third trenches from the substrate at positions corresponding to the second trenches and dividing the wafer into chips.

In a second aspect that includes the method according to the first aspect of the invention, the third trenches have a greater width than the second trenches.

In a third aspect that includes the method according to the first or second aspect of the invention, the third trenches have a greater width than the first trenches.

In a fourth aspect that includes the method according to any one of the first to third aspects of the invention, the third trenches are formed by using a laser beam or a dicing blade.

In a fifth aspect that includes the method according to any one of the first to fourth aspects of the invention, the third trenches are formed by combining a laser beam and a dicing blade.

In a sixth aspect that includes the method according to any one of the first to fourth aspects of the invention, the third trenches are formed by radiating a laser beam two times or more.

In a seventh aspect that includes the method according to any one of the first to sixth aspects of the invention, the substrate is lapped, ground or polished till a thickness thereof reaches 100 μm or less inclusive of an epitaxial layer prior to the formation of the third trenches.

In an eighth aspect that includes the method according to any one of the first to seventh aspects of the invention, the first conductive type semiconductor layer is an n-type semiconductor layer and the second conductive type semiconductor layer is a p-type semiconductor layer.

In a ninth aspect that includes the method according to any one of the first to eighth aspects of the invention, the substrate is a sapphire substrate.

In a tenth aspect that includes the method according to any one of the first to ninth aspects of the invention, the semiconductor light-emitting device is a nitride-based semiconductor light-emitting device or a gallium nitride-based semiconductor light-emitting device.

An eleventh aspect of this invention provides a semiconductor light-emitting device which is fabricated by using the method for the fabrication of the semiconductor light-emitting device according to any one of the first to tenth aspects of the invention.

By using the method for the fabrication of the semiconductor light-emitting device contemplated by this invention, it is made possible to obtain a semiconductor light-emitting device which is a chip having a smooth and stable external geometry, forming smooth broken faces, cut straight substantially perpendicularly to the face of emission and providing fully satisfactory efficiency of light extraction from the second surface of the chip or the outer peripheral part of the chip.

The above and other objects, characteristic features and advantage of the present invention will become apparent to those skilled in the art from the description given herein below with reference to the accompanying drawings.

BEST MODE FOR CARRYING OUT THE INVENTION

Now, the invention will be described below with reference to the accompanying drawings.

Figure 2:
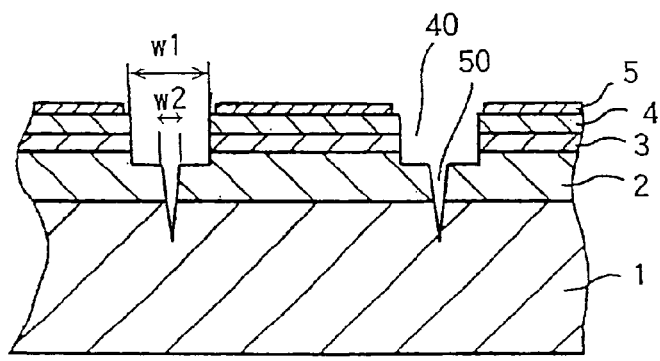
FIG. 2 is a cross section of first and second trenches formed on a semiconductor layer overlying a substrate.

The semiconductor layer in the method of fabrication according to this invention is provided, as illustrated in FIG. 2, at least with a first conductive type semiconductor layer 2, a light-emitting layer 3 (active layer) and a second conductive type semiconductor layer 4. It may further be provided with a contact layer and a buffer layer. These layers are stacked on a sapphire substrate, for example, as by the method of MOCVD.

On this semiconductor layer, first trenches 40 having a width W1 for exposing the first conductive type semiconductor layer (n-type as shown in FIG. 2) are formed by using an etching device and a photolithographic device. Since the trenches are required to expose the first conductive type semiconductor layer, they preferably have a depth approximating to ¾ of the thickness of the first conductive type semiconductor layer. At this time, a surface intended to form an n-type electrode may be simultaneously formed. On the second conductive type semiconductor layer (p-type as shown in FIG. 2), a p-type electrode 5 is formed by using a vacuum deposition device and a photolithographic device. On the n-type semiconductor layer, an n-type electrode is formed.

Then, second trenches 50 having a width of W2 and reaching from the first trenches to the substrate 1 are formed by using a laser beam. The second trenches 50 preferably have a depth in the approximate range of 20 μm to 50 μm. The second trenches are formed in a width smaller than that of the first trenches. This relation of the widths prevents the laser processing performed in forming the second trenches from inflicting damage on the light-emitting layer and the p-type layer (the second conductive type semiconductor layer). Particularly since the light-emitting layer is not directly irradiated with the laser beam, the laser beam inflicts virtually no effect on the light-emitting layer. Optionally, prior to the laser processing to form the second trench having a width smaller than W1 and reaching the substrate, the semiconductor layer may be coated with a protective film, such as of resist, in order to avoid direct adhesion of dust produced during the course of the laser processing and then radiating the laser beam to the coated semiconductor layer from above the first trenches.

Further, by forming the second trenches deep enough to expose the substrate from the semiconductor layer side, it is made possible to finish the end faces of chips with satisfactory reproducibility in a stable shape. As a result, the produced chips provide attractive appearance as commercial products and enable the intensity distribution of light emitted from the end faces thereof to be stabilized fully satisfactorily with high reproducibility.

Since the insertion of the second trenches exposing the substrate results in dividing the epitaxial layer, the wafer is enabled to mend the warp occurring therein.

When the wafer has the warp thereof so mended, the second surface of the substrate is enabled to be polished, lapped or ground easily and a thickness thereof can be rendered uniform. Since the wafer is capable of suppressing the warp even after the polishing, the variation of the focal position during the insertion of the third trenches with the laser beam can be suppressed. This suppression is effective in stabilizing the third trenches in shape.

Figure 3:
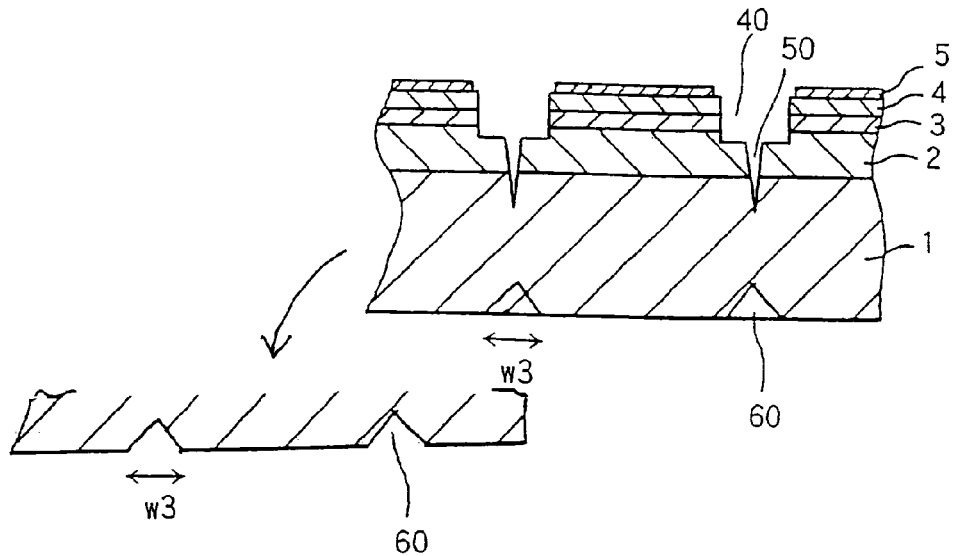
FIG. 3 is a cross section of third trenches formed on the second surface of the substrate shown in FIG. 2.

Subsequently, third trenches 60 having a width W3 greater than W2 are formed by using a laser processing device or a dicing blade from the second surface side of the substrate at positions corresponding to the second trenches (FIG. 3). When the protective film, such as of resist, was formed prior to the laser processing, it may be removed at this stage. Then, the individual chips are separated by cutting by using a breaker. When stress is exerted on the substrate with the breaker, it is concentrated in the bottom parts of the second trenches and the third trenches. The rupture which ensues enters from the bottoms of either the second or the third trenches and advances in the direction of the bottoms of the other trenches. Thus, the divided chips consequently obtained are allowed to acquire a neat shape of rupture uniformly with high reproducibility. When the wall surfaces of the V-shaped trenches of the third trenches are inclined toward the end faces of the chips or the wall surfaces are formed to be a U-shaped trench instead, the wall surfaces give rise to steps relative to the end faces of the chips. Consequently, the stepped portions enable the light to be extracted anew and consequently result in improving the efficiency of extraction of light to the exterior.

From the viewpoint of the efficiency of the extraction of light to the exterior, the third trenches preferably have a width greater than that of the second trenches and also greater than that of the first trenches. The third trenches have a depth preferably in the approximate range of one quarter to three quarters and more preferably in the approximate range of two fifths to three fifths of the width of the trenches. Though the formation of the third trenches may be implemented by the conventional dicing method, it is preferably accomplished by using a laser processing device in consideration of the practical operating time which pays due regard to the processing speed and the maintenance of a dicing blade 70. The laser processing device allows the third trenches to be frequently changed in shape to suit various conveniences, such as the kinds of chips offered for choice, for example. For the purpose of forming the trenches of a large width by the laser processing device without inflicting any damage to the semiconductor layer, it is necessary that the focal point of the laser beam be formed as separated from the substrate. When the focal point is moved away from the substrate, the trenches have the width thereof increase and the depth thereof decrease. When the focal point is moved farther away from the substrate, the trenches assume a broad V-shape groove. When the separation has proceeded further, the trenches eventually assume a U-shaped groove. When the separation further continues, they are changed to a W-shaped groove. The degree of this change of the shape depends on the optical system and the output of the laser beam to be used. When the W-shaped groove is assumed, the stress is no longer concentrated at one fixed point on the bottom of the trench and consequently the substrate is not separated with stability and prevented from breaking straight. For the purpose of enabling the third trenches to be formed in a large width and a large depth, the method of preparatorily forming trenches assuming the W-shaped groove by means of the laser beam and subsequently subjecting them to a dicing treatment for correction of shape by the use of a dicing device or the method of radiating the laser beam once again to the bottoms of the W-shaped grooves are adopted advantageously.

When the third trenches are formed by using only the dicing device, this process consumes longer time than the use of the laser processing device. When they are formed preparatorily with the laser beam and then subjected to an additional dicing treatment performed to an extent of correcting the shape, the machining allowance of the dicing can be reduced and the working time using the dicing device can be curtailed. Even when the third trenches are required to control their shape strictly, this method of processing proves effective. When the trenches are not required to control the shape strictly, the trenches can be formed in the V-shaped groove of a large width by irradiating the bottom parts of the W-shaped grooves with the laser beam. This method is effective in effecting the fabrication at a low cost. For the purpose of obtaining the shape as expected, the irradiation with the laser beam may be further repeated.

When the substrate is polished, lapped or ground until the thickness thereof inclusive of the epitaxial layer decreases to 100 μm or less, this decrease of the thickness brings the advantage of further facilitating the division of the substrate. By inserting the third trenches of a width greater than the first or the second trenches from the substrate side at the positions corresponding to the second trenches inserted from the semiconductor layer side after the polishing process of the substrate, it is made possible to form weak portions on the second surface of the substrate. These weak portions serve the purpose of preventing the end faces of the chips from being bent halfway along the length thereof during the course of the rupture. Further, since the third trenches are shaped as if the corner parts of the chips separated from the substrate were chamfered, the efficiency of the light extraction from the chamfered corners is improved.

When the step of forming the second trenches is executed before the substrate is polished, since the substrate is still thick and is warped only scantily, the focal position of the laser beam during the course of the laser processing is varied only sparingly and the trenches can be obtained in a stable shape. Further, since the second trenches expose the substrate, it is effective to suppress the warp of the substrate after the formation of the second trench. This measure results in obviating the necessity for exerting undue stress during the course of polishing, lapping or grinding the substrate. Consequently, the substrate can be prevented from sustaining a crack or broken chips while it is being polished, lapped or ground and therefore can be stably polished, lapped or ground. Since the substrate can be given a uniform thickness throughout the surfaces of the wafer, the amount of the light emitted through the wall surfaces of the third trenches is stabilized. For the sake of preventing the end faces of the chips from being separated with a tapered face, it is advisable to decrease the thickness of the substrate. The wafer having the second surface of the substrate polished and shaven preferably has a thickness of 100 µm or less. This thickness is preferably decreased to the fullest possible extent to 80 µm or less or to 60 µm or less, for example, for the sake of obtaining the cut faces from the second trenches to the third trenches with satisfactory reproducibility. When the thickness is unduly decreased, however, the warp in the substrate is increased excessively even to an extent of not only obstructing the insertion of the third trenches but also preventing the substrate from being divided with satisfactory reproducibility.

Now, this invention will be described specifically below with reference to examples. This invention, however, is not limited to these examples.

EXAMPLE 1

A blue light-emitting device formed of a nitride-based compound semiconductor was fabricated as follows.

On a sapphire substrate, an AlN layer, an under layer having a thickness of 4 µm and formed of undoped GaN, an n-side contact layer having a thickness of 2 µm and formed of Ge-doped (concentration $1 \times 10^{19}/cm^3$) GaN, an n-side cladding layer having a thickness of 12.5 nm and formed of Si-doped (concentration $1 \times 10^{18}/cm^3$) $In_{.1}Ga_{0.9}N$, a barrier layer having a thickness of 16 nm and formed of GaN and a well layer having a thickness of 2.5 nm and formed of $In_{.2}Ga_{.8}N$ are stacked alternatively up to five repetitions, and finally a light-emitting layer of a multiple quantum well structure provided with a barrier layer, a p-side cladding layer having a thickness of 2.5 nm and formed of Mg-doped (concentration $1 \times 10^{20}/cm^3$) $Al_{0.07}Ga_{0.93}N$ and a p-side contact layer having a thickness of 0.16 µm and formed of Mg-doped (concentration $8 \times 10^{19}/cm^3$) $Al_{0.02}Ga_{0.98}N$ are sequentially stacked to form a nitride-based compound semiconductor stacked structure.

At the prescribed position on the p-side contact layer of this nitride-based compound semiconductor stacked structure, a transparent positive electrode configured by stacking Pt and Au sequentially from the p-side contact layer was formed by using the photolithographic technique and the liftoff technique both known to the art. Subsequently, a positive electrode bonding pad configured by stacking Au/Ti/Al/Ti/Au layers as reckoned from the semiconductor side was formed by using the known photolithographic technique.

Figure 1:
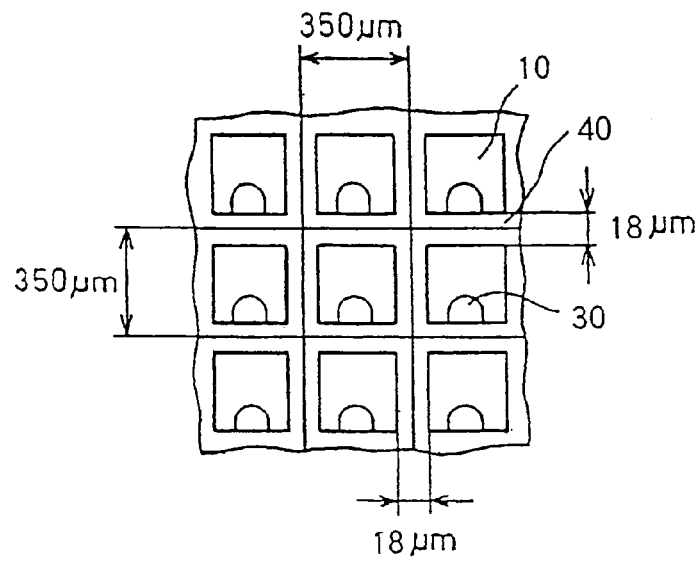
FIG. 1 is a plan view of the trenches and the electrodes formed on a semiconductor layer overlying a substrate.

Then, an etching treatment for exposing the n-type layer was performed by the known photolithographic technique and the known reactive ion etching technique so as to insert first trenches of a depth of 1 µm and give rise to divided chips having a pitch of 350 µm and a width of 18 µm as illustrated in FIG. 1. At the same time, n-side electrode forming surfaces 30 were formed in a semicircular shape by etching as illustrated in FIG. 1. Subsequently, n-side electrodes of a Cr/Ti/Au three-layer structure were formed on the n-side electrode forming surfaces.

The nitride-based compound semiconductor wafer thus obtained was forwarded to the cutting process. First, a water-soluble resist was uniformly applied with a spin coater to the entire semiconductor layer side surface of the wafer so as to prevent the nitride-based compound semiconductor layer from allowing adhesion thereto of the dirt generated by a cutting motion during the course of the laser processing and the applied coat of the resist was dried to give rise to a protective film having a thickness of 0.2 µm.

Then, the wafer after having a UV tape pasted to the sapphire substrate side thereof was fixed with a vacuum chuck on the stage of a pulsed laser processing device. The stage was so constructed as to be moved in the directions of the X axis (laterally) and the Y axis (lengthwise) and swiveled. After it had been fixed to the vacuum chuck, the laser optical system was adjusted so as to form the focal point of the laser on the first surface of the protective film. Then, by irradiating the first trenches with the laser from above so as to form second trenches 50 having a depth of 25 µm and a width of 10 µm at intervals of 350 µm in the direction of the X axis and expose the sapphire substrate as illustrated in FIG. 2. At this time, the trenches were formed in a V-shaped cross section. With the stage swiveled by 90 degrees, second trenches were similarly formed in the direction of the Y axis. After the formation of the trenches was completed, the vacuum chuck was set free and the wafer was ripped off the stage.

Then, the wafer was set on the stage of a cleaning device and deprived of the protective film by sweeping the semiconductor layer side surface thereof with a shower of water while keeping the wafer in spinning.

Subsequently, the wafer was thinned to a thickness of 80 µm inclusive of the epitaxial layer by lapping and polishing the second surface side of the sapphire substrate. The polishing was so performed as to give a uniform specular finish to the second surface of the substrate and allow easy visual examination of the second trenches from the sapphire substrate.

Then, the wafer after having a new UV tape pasted to the nitride-based compound semiconductor layer side thereof was again fixed with a vacuum chuck on the stage of a pulsed laser processing device. With the laser optical system adjusted to form the focal point of the laser on a level higher than the substrate, third trenches 60 having a depth of 15 µm and a width of 13 µm were formed in the direction of the X axis at positions on the opposite side of the second trenches relative to the substrate as illustrated in FIG. 3. Further, with the stage swiveled by 90 degrees, third trenches were similarly formed in the direction of the Y axis. After the formation of these trenches was completed, the vacuum chuck was set free and the wafer was ripped off the stage and cleaned with running water. The produced nitride-based compound semiconductor light-emitting device wafer, when the surface thereof was visually examined, showed virtually no discernible sign of defilement. Many chips each measuring the square of 350 µm were obtained by dividing the wafer with pressure and separating the divided pieces of the wafer from the sapphire substrate. When the cross sections of these chips were visually observed, they were found to be smooth, though not specular, faces extending from the bottom end of the V-shaped groove of the second trench into the third trench substantially perpendicularly to the main faces of the chips and the third trenches were found to be shaped as though they had resulted from chamfering the peripheries of the substrate. When the chips free from defective external shape were picked out, they totaled a yield of 90%. The bear chip mount was measured by a usual integrating sphere method, this light-emitting device showed an emission output in the range of 4.9 to 5.1 mW at a current of 20 mA.

COMPARATIVE EXAMPLE 1

Figure 4:
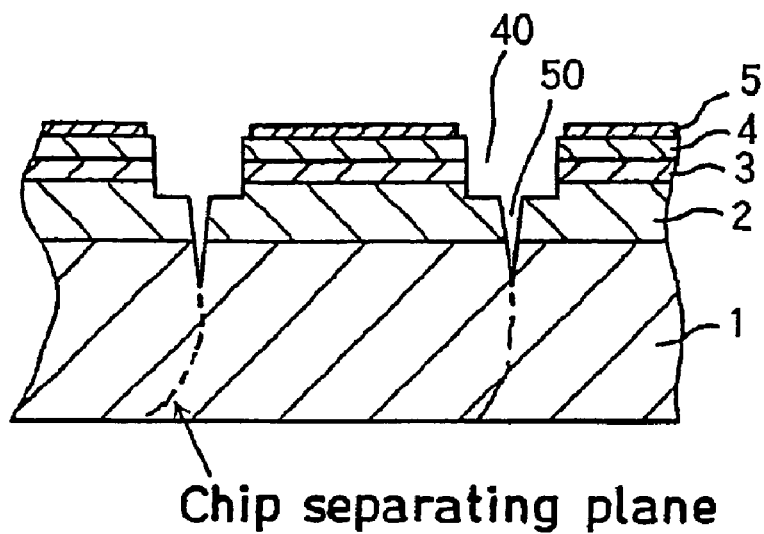
FIG. 4 is a cross section illustrating the separated faces of a comparative example provided with no third trench.

Nitride-based compound semiconductor light-emitting devices shaped like chips were fabricated by following the procedure of Example 1 while omitting the formation of third trenches. When the cross sections of these chips were visually observed, they were found to be smooth, though not specular, faces. Almost all of these chips were separated substantially perpendicularly from the leading terminal parts of the V-shaped second trenches to the main faces overlaid with a nitride-based compound semiconductor layer. Though some of the chips were separated substantially perpendicularly to the main faces on the substrate side, some other chips could not be separated perpendicularly as shown in FIG. 4. Thus, the chips produced in this experiment were not stably shaped. When the chips forming substantially perpendicular cross sections to the main faces on the substrate side and providing freedom from defective external shape were picked out, they totaled a yield of 50%. The bear chip mount was measured by a usual integrating sphere method, the light-emitting devices showed an emission output in the range of 4.4 to 4.6 mW at a current of 20 mA. When the chips which did not form a substantially perpendicular cross section to the main faces on the substrate side and did not show any other sign of defective external shape were made to form a bear chip mount and subjected to the measurement of an integrating sphere method, the output of emission was in the range of 4.6 to 5.2 mW at a current of 20 mA. They were thought to have the efficiency of light extraction improved owing to the fact that they were broken obliquely on the substrate side. Because the manner of breakage was irregular, the output of emission power was also dispersed.

EXAMPLE 2

Figure 5:
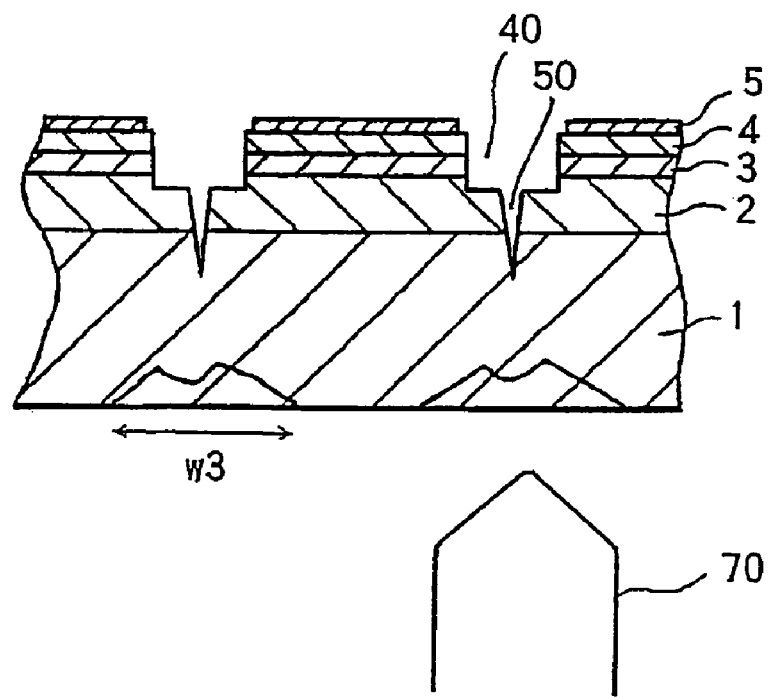
FIG. 5 is a cross section of third trenches having the shape of the letter W and a dicing blade for correcting the shape of the trenches.

Nitride-based compound semiconductor light-emitting devices shaped like chips were fabricated by following the procedure of Example 1 while performing the dicing treatment subsequently to the laser processing for the purpose of forming third trenches having a width of 20 μm and a depth of 30 μm. During the formation of the third trenches, the laser beam was radiated so as to form the focal point at a position separated by about 30 μm from the substrate. After the irradiation with the laser beam was completed, the third trenches were shaped with a width of 20 μm and a depth of 15 μm. Subsequently, the third trenches were corrected in shape by the laser processing treatment using a diamond blade having a V-shaped edge as illustrated in FIG. 5 and a blade width of 20 μm. After the correction of the shape was completed, the third trenches were found to have a width of 20 μm and a depth of 30 μm. This wafer was divided to afford chips. The end faces of these chips were substantially perpendicular to the main surfaces on the substrate side. When the chips which were free from defective external shape were picked out, they totaled a yield of 90%. In the measurement of integrating spheres assuming the state of bear chip mount, the light-emitting devices showed an emission output in the range of 4.9 to 5.5 mV at a current of 20 mA.

The first surfaces of the third trenches after the correction of shape were coarsened more than those before the correction of shape and were forced by the diamond blade to sustain minute irregularities. By the measurement according to the probe method, the surfaces acquired roughness in the range of 30 nm to 100 nm. The magnitude of surface roughness tended to increase in accordance as the precision of the formation of trenches by the diamond blade processing was heightened. This fact indicates that the formation of the circumferential terminal parts of the chips in the chamfered shape resulted in improving the effect of light extraction and the minute irregularities formed in the circumferential terminal parts of the chips as well resulted in further improving the effect of external extraction of light.

EXAMPLE 3

Nitride-based compound semiconductor light-emitting devices shaped like chips were fabricated by following the procedure of Example 1 while performing the laser processing treatment in two stages so as to form the third trenches having a width of 20 μm and a depth of 30 μm. In the laser processing of the first stage, the laser was radiated so as to form the focal point thereof at a position separated by about 30 μm from the substrate. The third trenches after the radiation of the laser beam had a width of 20 μm and a depth of 15 μm and assumed a W-latter cross section which resulted from the upward swell of the approximately central portions of the bottom parts thereof. The radiation of the laser beam in the second stage was performed with the focal point directed toward the approximate center of the W-letter cross section. The completed third trenches measured 20 μm in width and 35 μm in depth and assumed a nearly V-shaped groove, though slightly distorted as compared with the trenches obtained in the dicing treatment. This wafer was broken to afford chips. The end faces of the ruptured chips were substantially perpendicular to the main surfaces on the substrate side. When the chips free from defective external shape were picked out, they totaled a yield of 90%. In the measurement of integrating spheres assuming the state of bear chip mount, the light-emitting devices showed an emission output in the range of 4.9 to 5.4 mW at a current of 20 mA.

INDUSTRIAL APPLICABILITY

The semiconductor light-emitting device according to this invention has a high efficiency of light extraction and can be utilized for gallium nitride-based compound light-emitting devices using a sapphire substrate, gallium nitride-based compound light-emitting devices using an SiC substrate and other Group III-V compound semiconductor light-emitting devices. This device, when combined with a fluorescent material or with a light-emitting device formed of that material, is enabled to emit white light of high luminance.

The invention claimed is:

1. A method for the fabrication of a semiconductor light-emitting device, comprising the steps of:
    stacking at least a first conductive type semiconductor layer, an active layer and a second conductive type semiconductor layer on a substrate to form a wafer;
    forming on a side of growth surfaces of the semiconductor layers first trenches so as to expose a lateral surface of the first conductive type semiconductor layer at the end of the first trench forming step;
    forming second trenches reaching the substrate from above the first trenches by the use of a laser beam so that at least a part of the lateral surface of the first conductive type semiconductor layer remains exposed at the end of the second trench forming step;

forming third trenches from the substrate at positions corresponding to the second trenches by the use of a laser beam;

using a dicing blade to correct a shape of the third trenches; and dividing the wafer into chips.

2. A method according to claim 1, wherein the third trenches have a greater width than the second trenches.

3. A method according to claim 1, wherein the third trenches have a greater width than the first trenches.

4. A method according to claim 1, wherein the third trenches are formed by radiating a laser beam two times or more.

5. A method according to claim 1, wherein the substrate is lapped, ground or polished till a thickness thereof reaches 100 μm or less inclusive of an epitaxial layer prior to the formation of the third trenches.

6. A method according to claim 1, wherein the first conductive type semiconductor layer is an n-type semiconductor layer and the second conductive type semiconductor layer is a p-type semiconductor layer.

7. A method according to claim 1, wherein the substrate is a sapphire substrate.

8. A method according to claim 1, wherein the semiconductor light-emitting device is a nitride-based semiconductor light-emitting device.

9. A method according to claim 1, wherein the semiconductor light-emitting device is a gallium nitride-based semiconductor light-emitting device.

10. A semiconductor light-emitting device produced by using the method for the fabrication of the semiconductor light-emitting device according to claim 1.

* * * * *